United States Patent
Warren

(10) Patent No.: US 8,377,731 B2
(45) Date of Patent: Feb. 19, 2013

(54) MICRO ELECTRO-MECHANICAL SENSOR (MEMS) FABRICATED WITH RIBBON WIRE BONDS

(75) Inventor: Robert Warren, Newport Beach, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 13/236,532

(22) Filed: Sep. 19, 2011

(65) Prior Publication Data

US 2012/0009778 A1    Jan. 12, 2012

Related U.S. Application Data

(62) Division of application No. 12/054,169, filed on Mar. 24, 2008, now Pat. No. 8,022,490.

(51) Int. Cl.
    *H01L 21/00* (2006.01)
(52) U.S. Cl. .................. 438/50; 438/619; 257/E21.581
(58) Field of Classification Search .................. 438/411, 438/422
    See application file for complete search history.

(56) References Cited

U.S. PATENT DOCUMENTS

| | | | |
|---|---|---|---|
| 6,284,606 B1 | 9/2001 | Samudra et al. | |
| 6,635,506 B2 * | 10/2003 | Volant et al. | 438/52 |
| 7,017,662 B2 | 3/2006 | Schultz et al. | |
| 7,145,213 B1 | 12/2006 | Ebel et al. | |
| 7,581,324 B1 | 9/2009 | Rogers | |
| 2001/0054709 A1 | 12/2001 | Heath et al. | |
| 2002/0027064 A1 | 3/2002 | York et al. | |
| 2003/0107137 A1 * | 6/2003 | Stierman et al. | 257/763 |
| 2004/0020303 A1 | 2/2004 | Blomberg | |
| 2004/0164289 A1 | 8/2004 | Rueckes et al. | |
| 2007/0012354 A1 | 1/2007 | Kobayashi et al. | |
| 2007/0040547 A1 | 2/2007 | Berkcan et al. | |
| 2007/0045756 A1 | 3/2007 | Chang et al. | |
| 2008/0135826 A1 | 6/2008 | Fonash et al. | |
| 2008/0251723 A1 | 10/2008 | Ward et al. | |

OTHER PUBLICATIONS

European Patent Office; International Search Report and Written Opinion; PCT Application No. PCT/US2009/037663; Dec. 23, 2009.
The International Bureau of WIPO; International Preliminary Report on Patentability; PCT Application No. PCT/US2009/037663; Sep. 28, 2010.

* cited by examiner

*Primary Examiner* — Chandra Chaudhari
(74) *Attorney, Agent, or Firm* — Jackson Walker L.L.P.; Christopher J. Rourk

(57) ABSTRACT

A micro electro-mechanical sensor is provided. The micro electro-mechanical sensor includes a substrate, and a conducting plane disposed on the substrate. A conducting via is disposed on the substrate, such as adjacent to the conducting plane. A plurality of ribbon conductors are disposed over the conducting plane and electrically connected to the conducting via, such that the plurality of ribbon conductors form a transducer array in combination with the conducting plane, such as through capacitive coupling that changes in response to changes in the physical shape of the plurality of ribbons.

20 Claims, 4 Drawing Sheets

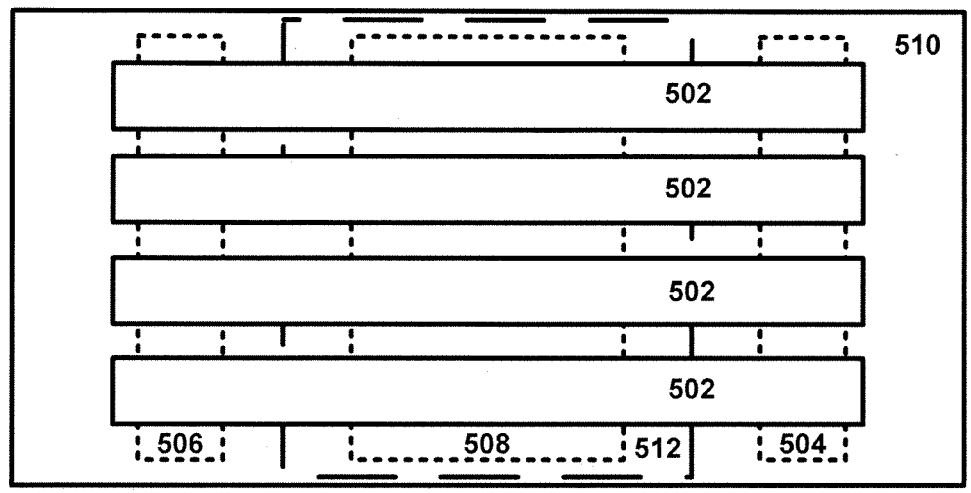
FIGURE 5    500
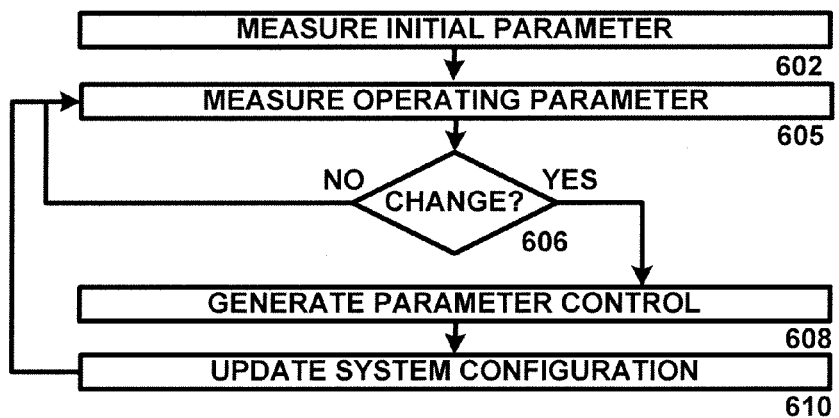
FIGURE 6    600

MICRO ELECTRO-MECHANICAL SENSOR (MEMS) FABRICATED WITH RIBBON WIRE BONDS

The present application is a divisional of U.S. Ser. No. 12/054,169 filed Mar. 24, 2008, entitled "MICRO ELECTRO-MECHANICAL SENSOR (MEMS) FABRICATED WITH RIBBON WIRE BONDS" which is hereby incorporated by reference for all purposes.

FIELD OF THE INVENTION

The invention relates to micro electro-mechanical sensors, and more specifically to a method and apparatus for a capacitive micro electro-mechanical sensor fabricated with ribbon wire bonds.

BACKGROUND OF THE INVENTION

The field of micro electro-mechanical devices is relatively new. While some micro electro-mechanical devices have been fabricated, the use of micro electro-mechanical devices has not been well developed, and applications for micro electro-mechanical devices are not well known. The best known micro electro-mechanical device may be the digital light projector (DLP) device, which is used to generate projected images. Sensors utilizing micro electro-mechanical devices are not generally known.

SUMMARY OF THE INVENTION

The current invention provides a micro electro-mechanical sensor.

In accordance with an exemplary embodiment of the present invention, a micro electro-mechanical sensor is provided. The micro electro-mechanical sensor includes a substrate, and a conducting plane disposed on the substrate. A conducting via is disposed on the substrate, such as adjacent to the conducting plane. A plurality of ribbon conductors are disposed over the conducting plane and electrically connected to the conducting via, such that the plurality of ribbon conductors form a transducer array in combination with the conducting plane, such as through capacitive coupling that changes in response to changes in the physical shape of the plurality of ribbons.

Those skilled in the art will further appreciate the advantages and superior features of the invention together with other important aspects thereof on reading the detailed description that follows in conjunction with the drawings.

BRIEF DESCRIPTION OF THE SEVERAL VIEWS OF THE DRAWINGS

FIG. 5 is a diagram of a micro electro-mechanical sensor in accordance with an exemplary embodiment of the present invention;

FIG. 6 is a diagram of a method for monitoring a micro electro-mechanical sensor in accordance with an exemplary embodiment of the present invention;

DETAILED DESCRIPTION OF PREFERRED EMBODIMENTS

Figure 1:
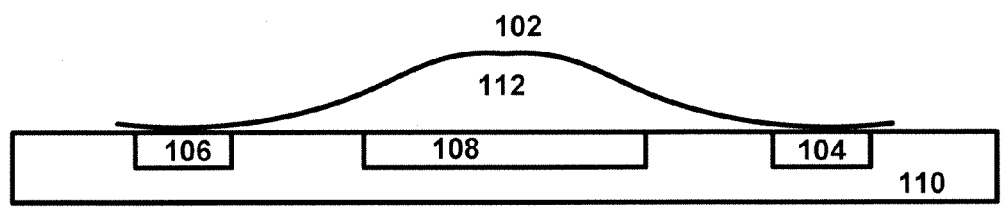
FIG. 1 is a diagram of a micro electro-mechanical sensor in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of a micro electro-mechanical sensor 100 in accordance with an exemplary embodiment of the present invention. Micro electro-mechanical sensor 100 can use a multi-resonant array to detect and measure sound waves, pressure, force, acceleration, flow rate, or other physical forces.

Micro electro-mechanical sensor 100 includes a plurality of ribbon wires 102 that are bonded to conductive vias 104 and 106, such as by wedge bonding or in other suitable manners. In one exemplary embodiment, ribbon wires 102 can be 6-10 micron thick gold ribbon wire that is 50-100 microns wide, and can be bonded side-by-side, approximately 50-100 microns apart, and vary in length from 100 to 1000 microns. Likewise, other suitable wires can be used, such as round wires or wires having other suitable dimensions that have a dynamic response to allow them to be used as sensor elements.

Ribbon wires 102 are mounted over conducting plane 108, which is disposed on substrate 110, to form an air gap 112. In one exemplary embodiment, conductive vias 104 and 106 and conducting plane 108 can be formed in substrate 110 using chemical vapor deposition, direct metal deposition, or other suitable processes. Substrate 110 can alternatively be implemented as an organic printed circuit board, where conductive vias 104 and 106 and conducting plane 108 can be formed via subtractive or additive copper plating processes or by other suitable processes. Ribbon wires 102 can then be mounted utilizing wedge bonding or other suitable processes. Likewise, where round wires are utilized, wedge bonding, ball bonding, or other suitable round wire bonding processes can be utilized.

In operation, micro electro-mechanical sensor 100 provides a multi-resonant transducer array for detection and measurement of sound waves, pressure, force, acceleration, flow rate, or other physical forces. Changes in the shape of ribbon wires 102 can be detected by measuring the capacitance between ribbon wires 102 and conducting plane 108 or other suitable parameters, which can be correlated to sound waves, pressure, force, acceleration, flow rate, or other physical forces received at micro electro-mechanical sensor 100.

Figure 2:
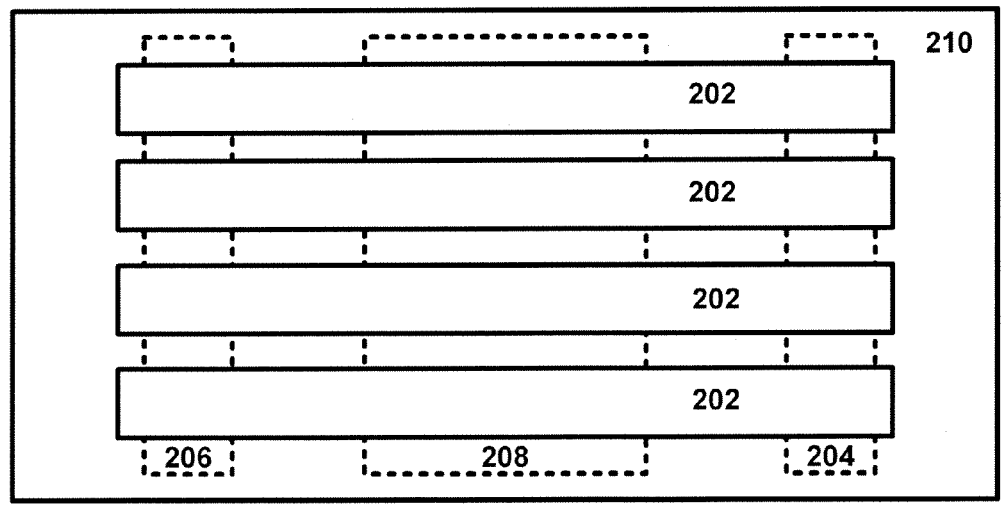
FIG. 2 is a diagram of a micro electro-mechanical sensor in accordance with an exemplary embodiment of the present invention.

FIG. 2 is a diagram of micro electro-mechanical sensor 200 in accordance with an exemplary embodiment of the present invention. Micro electro-mechanical sensor 200 includes a plurality of ribbon wires 202 that are bonded to conductive vias 204 and 206, and which are disposed over conducting plane 208. Conductive vias 204 and 206 and conducting plane 208 are disposed on substrate 210. In one exemplary embodiment, conductive vias 204 and 206 and conducting plane 208 can be formed in substrate 210 using chemical vapor deposition, direct metal deposition, or other suitable processes. Ribbon wires 202 can then be mounted utilizing wedge bonding or other suitable processes.

Figure 3:
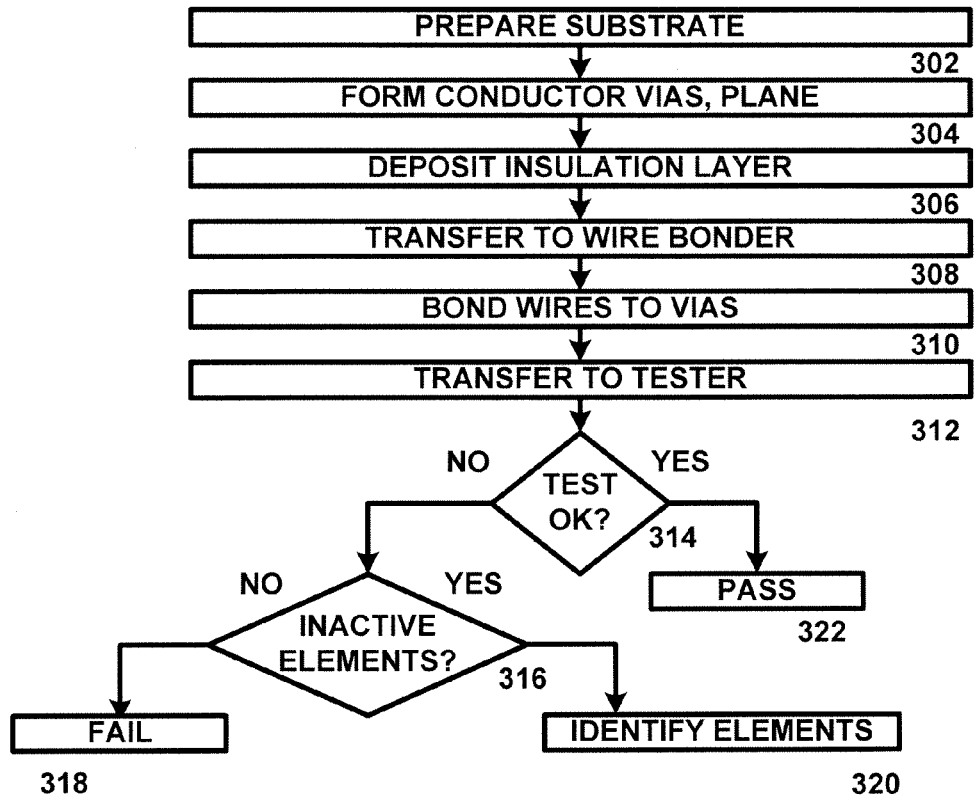
FIG. 3 is a diagram of a method for manufacturing a micro electro-mechanical sensor in accordance with an exemplary embodiment of the present invention.

FIG. 3 is a diagram of a method 300 for manufacturing a micro electro-mechanical sensor in accordance with an exemplary embodiment of the present invention. Method 300 begins at 302, where a substrate such as a silicon substrate or other suitable substrate is prepared. The method then proceeds to 304, where a conducting plane and conducting vias are formed, such as by chemical vapor deposition, direct metal deposition, or other suitable processes. Additional devices can also or alternatively be formed, such as one or more transistors, diodes, capacitors, inductors, resistors, or other suitable devices. The method then proceeds to 306.

At 306, an insulation layer is deposited over the conducting plane or in other suitable locations, where suitable. The method then proceeds to 308 where the substrate is transferred to a wire bonder, such as a wedge bonder or other suitable bonders. The method then proceeds to 310 where a plurality of ribbon wires are bonded to the conductive vias, such as using wedge bonding or other suitable processes. The method then proceeds to 312.

At 312, the substrate is transferred to a tester, such as to test the resistance of the bonds, to test the capacitance of the array or individual elements of the array, or to perform other suitable tests. The method then proceeds to 314 where it is determined whether the test results are acceptable. If it is determined that the test results are not acceptable, the method proceeds to 316, otherwise the method proceeds to 322 where a pass indication is generated.

At 316, it is determined whether one or more elements of the multi-resonant array are inactive, such as where the multi-resonant array is provided with a number of spare elements that can be inactivated or compensated for. If it is determined that the failure is not due to a detectable number of inactive elements, the method proceeds to 318 where a fail indication for the micro electro-mechanical sensor is generated. Otherwise, the method proceeds to 320 where the failed elements, acceptable elements, or other suitable elements are identified. The micro electro-mechanical sensor can be categorized based on its capacitance, fusible links can be activated to isolate defective elements, or other suitable identification procedures can be utilized.

In operation, method 300 allows a micro electro-mechanical sensor to be fabricated, such as by using a combined deposition and wire bonding process or in other suitable manners. Method 300 further allows the micro electro-mechanical sensor to be tested to determine whether the micro electro-mechanical sensor meets predetermined parameters, to classify the micro electro-mechanical sensor based on predetermined parameters, or to otherwise perform post-manufacturing testing and classification of micro electro-mechanical sensors.

Figure 4:
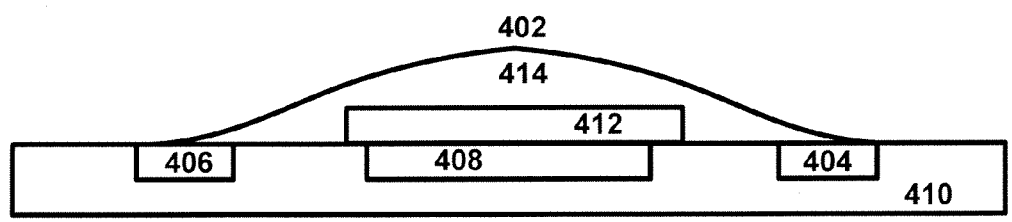
FIG. 4 is a diagram of a micro electro-mechanical sensor in accordance with an exemplary embodiment of the present invention.

FIG. 4 is a diagram of a micro electro-mechanical sensor 400 in accordance with an exemplary embodiment of the present invention. Micro electro-mechanical sensor 400 can use a multi-resonant array to detect and measure sound waves, pressure, force, acceleration, flow rate, or other physical forces.

Micro electro-mechanical sensor 400 includes a plurality of ribbon wires 402 that are bonded to conductive vias 404 and 406, such as by wedge bonding or in other suitable manners. In one exemplary embodiment, ribbon wires 402 can be 6-10 micron thick gold ribbon wire that is 50-100 microns wide, and can be bonded side-by-side, approximately 50-100 microns apart, and vary in length from 100 to 1000 microns.

Ribbon wires 402 are mounted over conducting plane 408 and insulation layer 412, both of which are disposed on substrate 410, and can include an air gap 414. In one exemplary embodiment, conductive vias 404 and 406 and conducting plane 408 can be formed in substrate 410 using chemical vapor deposition, direct metal deposition, or other suitable processes. Insulation layer 412 can be formed using silicon dioxide deposition or other suitable processes, such as where an insulating material is provided that operates in conjunction with ribbon wires 402 to provide a multi-resonant transducer array. Insulation layer 412 can be shaped to provide predetermined dielectric properties where suitable. Ribbon wires 402 can then be mounted utilizing wedge bonding or other suitable processes.

In operation, micro electro-mechanical sensor 400 provides a multi-resonant transducer array for detection and measurement of sound waves, pressure, force, acceleration, flow rate, or other physical forces. Changes in the shape of ribbon wires 402 can be detected by measuring the capacitance between ribbon wires 402 and conducting plane 408 or other suitable parameters, which can be correlated to sound waves, pressure, force, acceleration, flow rate, or other physical forces received at micro electro-mechanical sensor 400. Insulation layer 412 can be used to provide a physical barrier between ribbon wires 402 and conducting plane 408 so as to prevent inadvertent contact, can be used to modify the dielectric properties of air gap 414 or otherwise be used to modify the response of micro electro-mechanical sensor 400 to changes in pressure, sound, force, or other physical parameters, or can be used for other suitable purposes.

FIG. 5 is a diagram of micro electro-mechanical sensor 500 in accordance with an exemplary embodiment of the present invention. Micro electro-mechanical sensor 500 includes a plurality of ribbon wires 502 that are bonded to conductive vias 504 and 506, and which are disposed over conducting plane 508. Insulating layer 512 is provided to prevent inadvertent contact between ribbon wires 502 and conducting plane 508, to provide suitable dielectric properties, or for other suitable purposes. Conductive vias 504 and 506, conducting plane 508 and insulating layer 512 are disposed on substrate 510. In one exemplary embodiment, conductive vias 504 and 506 and conducting plane 508 can be formed in substrate 510 using chemical vapor deposition, direct metal deposition, or other suitable processes, and insulating layer 512 can be formed using silicon dioxide deposition or other suitable processes. Ribbon wires 502 can then be mounted utilizing wedge bonding or other suitable processes.

FIG. 6 is a diagram of a method 600 for monitoring a micro electro-mechanical sensor in accordance with an exemplary embodiment of the present invention. Method 600 begins at 602 where an initial parameter is measured. In one exemplary embodiment, the initial parameter can be total sensor capacitance, total sensor inductance, total sensor resistance, total sensor impedance, or other variables for a resonant sensor array. Likewise, the functionality of individual sensor ribbon wires, groups of sensor ribbon wires or other suitable parameters can be measured, where suitable. The method then proceeds to 604.

At 604, an operating parameter is measured. In one exemplary embodiment, the operating parameter can be the same parameter measured at 602, or other suitable operating parameters can also or alternatively be measured, such as parameters derived from a measured signal, power consumption, current or voltage characteristics, or other suitable parameters. The method then proceeds to 606.

At 606, it is determined whether a change in the initial or operating parameters has occurred. In one exemplary embodiment, a comparison can be made between the initial and operating parameters where the same parameter is being measured. In another exemplary embodiment, additional testing can be performed where a first operating parameter, such as a change in the signal measured by the sensor, the power consumption of the sensor, the current or voltage characteristics of the sensor, or other suitable operating parameters, is used to determine whether a change in sensor operation has occurred, at which point additional testing can be performed to determine whether a ribbon wire, group of ribbon wires or other suitable components have shorted, have become an open circuit, or have otherwise become inoperable. If it is determined that no change has occurred, the method returns to 605, otherwise the method proceeds to 608.

At 608, a parameter control is generated. In one exemplary embodiment, a ribbon wire that has shorted can be isolated or inactivated, such as by using a switching device, a fusible link, or other suitable devices. In another exemplary embodiment, the initial parameter can be re-determined, such as where the micro electro-mechanical sensor can be operated with a reduced number of ribbon wire elements. The method then proceeds to 610, where the system configuration is updated, such as to modify signal processing parameters to utilize the micro electro-mechanical sensor with different sensor parameters, to reset the initial parameter, or in other suitable manners. The method then returns to 605. Likewise, if it is determined that system operation can not continue due to sensor inoperability, an error signal or other suitable control can be generated to indicate that the sensor is no longer functional.

In operation, method 600 allows a micro electro-mechanical sensor to be utilized in a system for measuring sound, pressure, force, acceleration, flow rate or other suitable forces, so as to detect when sensor parameters have changed and to modify system operation or sensor configuration, where possible. Method 600 allows a micro electro-mechanical sensor or a system utilizing a micro electro-mechanical sensor to be dynamically configured during operation so as to avoid interruption of system operation.

Figure 7:
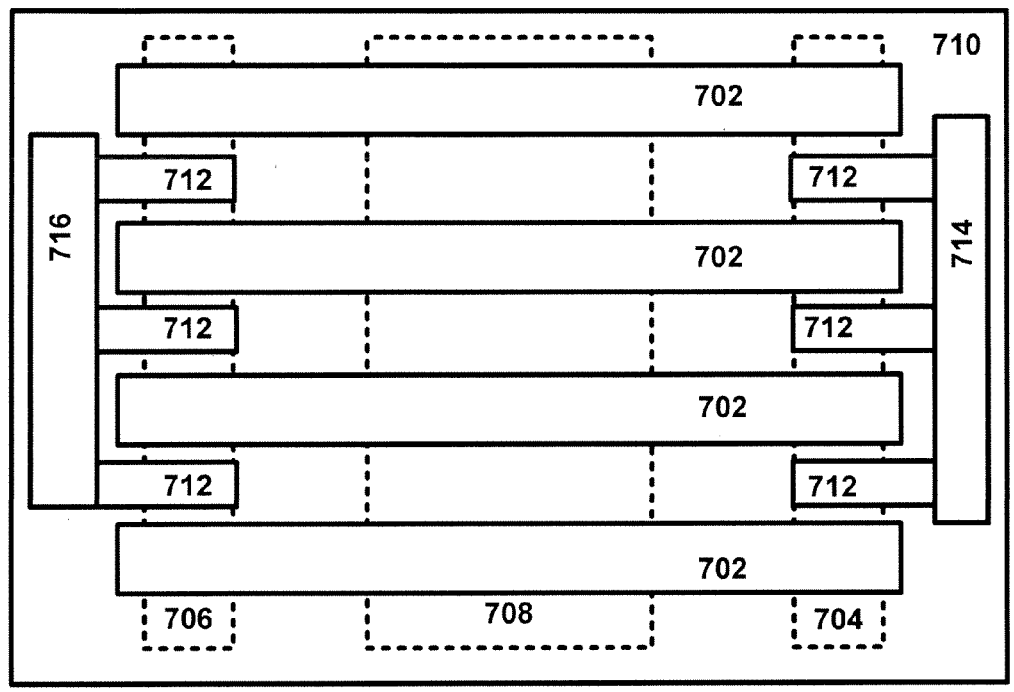
FIG. 7 is a diagram of a micro electro-mechanical sensor in accordance with an exemplary embodiment of the present invention.

FIG. 7 is a diagram of micro electro-mechanical sensor 700 in accordance with an exemplary embodiment of the present invention. Micro electro-mechanical sensor 700 includes a plurality of ribbon wires 702 that are bonded to conductive vias 704 and 706, and which are disposed over conducting plane 708. Conductive vias 704 and 706 and conducting plane 708 are disposed on substrate 710. In one exemplary embodiment, conductive vias 704 and 706 and conducting plane 708 can be formed in substrate 710 using chemical vapor deposition, direct metal deposition, or other suitable processes. Ribbon wires 702 can then be mounted utilizing wedge bonding or other suitable processes.

Micro electro-mechanical sensor 700 includes devices 712 and controllers 714 and 716, which can also be formed using chemical vapor deposition or other suitable processes. In one exemplary embodiment, devices 712 can be switches, transistors, or other suitable devices that allow individual ribbon wires 702 or groups of ribbon wires 702 to be switched in or out of a multi-resonant sensor array in response to control signals received from controllers 714 and 716. In another exemplary embodiment, devices 712 can be fusible links or other suitable devices that allow individual ribbon wires 702 or groups of ribbon wires 702 to be isolated, such as where individual ribbon wires 702 or groups of ribbon wires 702 have shorted or otherwise become inoperable.

In operation, micro electro-mechanical sensor 700 provides additional controls to allow individual ribbon wires 702 or groups of ribbon wires 702 to be selectively included in or excluded from a multi-resonant array of ribbon wires. Micro electro-mechanical sensor 700 can be used in systems where a change in the operating parameters of the sensor is required or utilized, can be used to allow continued operation of a system utilizing micro electro-mechanical sensor 700 in the event of a non-catastrophic failure of micro electro-mechanical sensor 700, or can be used in other suitable applications.

Figure 8:
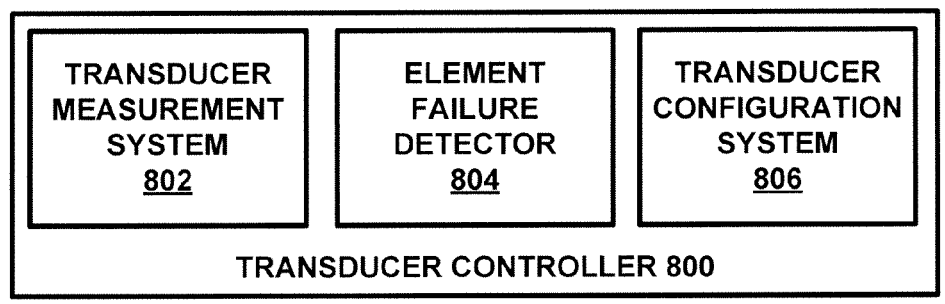
FIG. 8 is a diagram of a system for controlling a micro electro-mechanical sensor in accordance with an exemplary embodiment of the present invention.

FIG. 8 is a diagram of a system for controlling a micro electro-mechanical sensor in accordance with an exemplary embodiment of the present invention. Transducer controller 800 includes transducer measurement system 802, element failure detector 804 and transducer configuration system 806, each of which can be implemented in hardware, software, or a suitable combination of hardware and software, and which can be one or more software systems operating on a suitable processing platform. As used herein, "hardware" can include a combination of discrete components, an integrated circuit, an application-specific integrated circuit, a field programmable gate array, a digital signal processor, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

Transducer controller 800 is coupled to a suitable micro electro-mechanical sensor. As used herein, the term "coupled" and its cognate terms such as "couples" or "couple," can include a physical connection (such as a wire, optical fiber, or a telecommunications medium), a virtual connection (such as through randomly assigned memory locations of a data memory device or a hypertext transfer protocol (HTTP) link), a logical connection (such as through one or more semiconductor devices in an integrated circuit), other suitable connections, or a suitable combination of connections.

Transducer measurement system 802 receives transducer data from a micro electro-mechanical sensor and generates measurement data defining one or more parameters of the micro electro-mechanical sensor. In one exemplary embodiment, transducer measurement system 802 can determine a number of ribbon wires in a multi-resonant array, such as by measuring a capacitance of the multi-resonant array, a number of active ribbon wires, or other suitable parameters. Transducer measurement system 802 can also or alternatively measure a voltage or voltage waveform, a current or current waveform, an impedance, a resistance, an inductance, a number of activated devices such as fusible links, or other suitable parameters, and can generate data identifying the measured parameter, such as for use by a system that utilizes the micro electro-mechanical sensor.

Element failure detector 804 receives data from a micro electro-mechanical sensor and determines whether a failure of the micro electro-mechanical sensor or one or more components of the micro electro-mechanical sensor has occurred. In one exemplary embodiment, element failure detector 804 can determine a number of ribbon wires in a multi-resonant array, such as by measuring a capacitance of the multi-resonant array, a number of active ribbon wires, or other suitable parameters, and can compare that number to a previously-determined number of ribbon wires, such as one determined by transducer measurement system 802. Element failure detector 804 can also or alternatively measure a voltage or voltage waveform, a current or current waveform, an impedance, a resistance, an inductance, a number of activated devices such as fusible links, or other suitable parameters, and can generate data identifying a change in the measured parameter, such as to indicate that a component of a micro electro-mechanical sensor or the entire micro electro-mechanical sensor has failed.

Transducer configuration system 806 receives micro electro-mechanical sensor failure data, system configuration data or other suitable data and generates control data for a micro electro-mechanical sensor, a system utilizing a micro electro-mechanical sensor, or other suitable data. In one exemplary embodiment, transducer configuration system 806 can reconfigure a micro electro-mechanical sensor to compensate for one or more failed ribbon wires or other components, such as by isolating the failed component utilizing switches, fusible links, or other suitable devices. In another exemplary embodiment, transducer configuration system 806 can control a configuration of a micro electro-mechanical sensor, such as by selectively operating one or more ribbon wires or groups of ribbon wires in a multi-resonant array or other suitable components.

In operation, transducer controller 800 allows a micro electro-mechanical sensor, such as a multi-resonant array of ribbon wires or other suitable micro electro-mechanical sensors, to be used in a system that receives and processes signals from the micro electro-mechanical sensor, such as to measure sound, force, pressure, acceleration, flow rate, or other suitable physical forces. Transducer controller 800 allows a micro electro-mechanical sensor to be dynamically monitored, configured or otherwise controlled.

Although exemplary embodiments of a method and apparatus of the present invention have been described in detail herein, those skilled in the art will also recognize that various substitutions and modifications can be made to the method and apparatus without departing from the scope and spirit of the appended claims.

What is claimed is:

1. A method of manufacturing a micro electro-mechanical sensor comprising;
    forming a conducting plane on a substrate;
    forming a conducting via on the substrate;
    forming a plurality of active devices between segments of the conducting via; and
    bonding a plurality of metallic ribbon conductors to the conducting via, wherein the plurality of metallic ribbon conductors are disposed over the conducting plane.

2. The method of claim 1 wherein bonding the plurality of metallic ribbon conductors to the conducting via comprises wedge bonding the plurality of metallic ribbon conductors to the conducting via.

3. The method of claim 1 wherein forming the conducting via on the substrate comprises forming two conducting vias on the substrate.

4. The method of claim 3 wherein forming two the conducting vias on the substrate further comprises forming a plurality of active devices between segments of the conducting vias.

5. The method of claim 1 further comprising forming an insulating layer over the conducting plane.

6. A method of manufacturing a device comprising;
    forming a conducting plane on a substrate;
    forming a conducting via on the substrate;
    bonding a conductor to the conducting via, wherein the conductor is disposed over the conducting plane; and
    forming an active device that is electrically coupled to the conductor.

7. The method of claim 6 wherein bonding the conductor to the conducting via comprises wedge bonding the conductor to the conducting via.

8. The method of claim 6 wherein forming the conducting via on the substrate comprises forming a plurality of conducting vias on the substrate.

9. The method of claim 6 wherein forming the conducting via on the substrate further comprises forming a plurality of active devices between segments of the conducting via.

10. The method of claim 6 further comprising forming an insulating layer over the conducting plane.

11. The method of claim 6 further comprising forming an air gap between the conductor and the conducting plane.

12. The method of claim 6 further comprising forming a bus structure coupled to the active device.

13. A method of manufacturing a device comprising;
    forming a conducting plane on a substrate;
    forming an active device on the substrate;
    electrically coupling a conductor to the active device, wherein the conductor is disposed over the conducting plane so as to form an air gap.

14. The method of claim 13 wherein electrically coupling the conductor to the active device comprises wedge bonding the conductor.

15. The method of claim 13 comprising forming a conducting via on the substrate.

16. The method of claim 15 wherein forming the conducting via on the substrate further comprises forming a plurality of active devices between segments of the conducting via.

17. The method of claim 13 further comprising forming an insulating layer over the conducting plane.

18. The method of claim 13 further comprising forming a bus structure coupled to the active device.

19. The method of claim 1 wherein bonding the plurality of metallic ribbon conductors to the conducting via comprises:
    placing first metallic ribbon conductors on the conducting via;
    bonding the first metallic ribbon conductors to the conducting via; and
    placing second metallic ribbon conductors on the conducting via after bonding the first metallic ribbon conductors.

20. The method of claim 13 wherein electrically coupling the conductor to the active device comprises electrically coupling the conductor to the active device after placing the conductor over the conducting plane and forming an air gap between the conductor and the conducting plane.

* * * * *

UNITED STATES PATENT AND TRADEMARK OFFICE
CERTIFICATE OF CORRECTION

PATENT NO. : 8,377,731 B2  
APPLICATION NO. : 13/236532  
DATED : February 19, 2013  
INVENTOR(S) : Robert Warren Page 1 of 1

It is certified that error appears in the above-identified patent and that said Letters Patent is hereby corrected as shown below:

In the Claims

Claim 4, Column 8, line 1, replace "two the" with "the two"

Signed and Sealed this
Twenty-fifth Day of June, 2013

Teresa Stanek Rea
*Acting Director of the United States Patent and Trademark Office*